(12) United States Patent
Bae et al.

(10) Patent No.: US 7,459,848 B2
(45) Date of Patent: Dec. 2, 2008

(54) ORGANIC ELECTROLUMINESCENCE DEVICE AND FABRICATION METHOD THEREOF

(75) Inventors: Sung Joon Bae, Gyeonggi-do (KR); Jae Yoon Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 636 days.

(21) Appl. No.: 11/159,304

(22) Filed: Jun. 23, 2005

(65) Prior Publication Data

US 2005/0285511 A1    Dec. 29, 2005

(30) Foreign Application Priority Data

Jun. 25, 2004    (KR)    ............... 10-2004-0047947

(51) Int. Cl.
    *H01J 1/62*    (2006.01)

(52) U.S. Cl. ........................... 313/504; 313/506
(58) Field of Classification Search ............ 313/498, 313/504, 506, 509
    See application file for complete search history.

(56) References Cited

U.S. PATENT DOCUMENTS

2005/0046341 A1 *    3/2005    Ikeda et al. ............ 313/504

* cited by examiner

*Primary Examiner*—Vip Patel
(74) *Attorney, Agent, or Firm*—Morgan Lewis & Bockius LLP

(57) ABSTRACT

An organic electroluminescence device includes a buffer formed in a polygonal structure corresponding to each of sub-pixels, an electrode separator formed along an outer periphery of the buffer so as to separate the sub-pixels, an emission region formed in an inner region defined by the buffer, and an electric connection region formed in a region protruding from one side of the buffer.

12 Claims, 5 Drawing Sheets

ORGANIC ELECTROLUMINESCENCE DEVICE AND FABRICATION METHOD THEREOF

This application claims the benefit of the Korean Patent Application No. 10-2004-0047947, filed Jun. 25, 2004, which is hereby incorporated by reference.

BACKGROUND OF THE INVENTION

1. Field of the Invention

The present invention relates to an organic electroluminescence device and a fabrication method thereof, and more particularly, to a top emission type organic electroluminescence device and a fabrication method thereof.

2. Discussion of the Related Art

In the field of flat panel display (FPD) devices, a liquid crystal display (LCD) device is widely utilized because it is lightweight and has low power consumption. However, the LCD device is a non-luminous display device and has technical limitations in brightness, contrast, viewing angle, and trend toward large size. For this reason, new flat panel display devices capable of overcoming these drawbacks have been actively developed.

One of the new flat panel display devices is an organic electroluminescence device. Since the organic electroluminescence device is a self-luminous display device, it has high contrast and wide viewing angle compared with the LCD device. Also, since the organic electroluminescence device does not require a backlight assembly, it is lightweight and slim. Moreover, the organic electroluminescence device is more efficient in power consumption.

The organic electroluminescence device is driven at a low DC voltage and has a rapid response time. Since all of the components of the organic electroluminescence device are formed of solid materials, they are durable against external impact. Also, the organic electroluminescence device can be manufactured in a wide temperature range, thereby saving manufacturing costs. In particular, the organic electroluminescence device can be easily fabricated through a deposition process and an encapsulation process. Therefore, the fabrication method and apparatus of the organic electroluminescence device are simpler than those of LCD device or plasma display panel (PDP) device. If the organic electroluminescence device is driven in an active matrix type, uniform brightness can be obtained even when a low current is applied. Accordingly, the organic electroluminescence device has advantages of low power consumption, high definition and large-sized screen.

FIG. 1 is a schematic sectional view of an active matrix organic electroluminescence device (AMOLED) that operates in a bottom emission type according to the related art. As shown in FIG. 1, first and second substrates 10 and 30 are arranged facing each other, and edge portions of the first and second substrates 10 and 30 are encapsulated by a seal pattern 40. A thin film transistor (TFT) T is formed on a transparent substrate 1 of the first substrate 10 in subpixel unit, and a first electrode 12 is connected to the TFT T. An organic electroluminescent layer 14 is formed on the TFT T and the first electrode 12 and also corresponds to the first electrode 12. The organic electroluminescent layer 14 contains light emission materials providing red, green and blue colored lights. A second electrode 16 is formed on the organic electroluminescent layer 14. The first and second electrodes 12 and 16 apply an electric field to the organic electroluminescent layer 14.

The seal pattern 40 separates the second electrode 16 from the second substrate 30 by a predetermined distance. An absorbent (not shown) and a translucent tape (not shown) may be further provided on an inner surface of the second substrate 30 such that the translucent tape bonds the absorbent to the second substrate 30 and the absorbent absorbs moisture introduced from an exterior.

In the bottom emission type structure, when the first electrode 12 and the second electrode 16 respectively serve as an anode and a cathode, the first electrode 12 is formed of a transparent conductive material and the second electrode 16 is formed of a metal having a low work function. In such an arrangement, the organic electroluminescent layer 14 includes a hole injection layer 14a, a hole transporting layer 14b, an emission layer 14c, and an electron transporting layer 14d, which are sequentially deposited on the first electrode 12. The emission layer 14c has red, green and blue color filters R, G, B in the sub-pixels. Thus, the array element and the organic electroluminescence diode are stacked on the same first substrate 10.

The bottom emission type organic electroluminescence device is fabricated by attaching a substrate, where the array element and the organic electroluminescence diode are formed, to another separate substrate provided for the encapsulation. In this case, the yield of the organic electroluminescence device is determined by the individual yields of the array element and the organic electroluminescence diode. Accordingly, the entire process yield is greatly restricted by the later process, namely, the process of forming the organic electroluminescence diode. For example, although excellent array elements are formed, as long as foreign particles or other factors cause defects in forming the organic electroluminescent layer using a thin film of about 1000 Å thick, the corresponding organic electroluminescence device will be determined to be defective. As a result, all of the expense and material costs spent in fabricating the non-defective array element will be lost, thereby degrading the yield.

While the bottom emission type organic electroluminescence device has high stability and high degree of freedom due to the encapsulation, it has limitations with regard to aperture ratio. Thus, it is difficult to apply the bottom emission type organic electroluminescence device to high-definition products. In the case of a top emission type organic electroluminescence device, the design of the TFTs is easy and the aperture ratio is high. In light of the overall lifetime of the product, it is advantageous to utilize the top emission type organic electroluminescence device. However, since the cathode is disposed on the organic electroluminescent layer, the selection of material is restricted. As a result, the transmittance is limited and the luminous efficiency is degraded.

SUMMARY OF THE INVENTION

Accordingly, the present invention is directed to an organic electroluminescence device and a fabrication method thereof that substantially obviate one or more problems due to limitations and disadvantages of the related art.

An object of the present invention is to provide an organic electroluminescence device and a fabrication method having an organic electroluminescent layer that can be formed uniformly and the aperture ratio can be improved.

Another object of the present invention is to provide an organic electroluminescence device and a fabrication method that can bring about an improved yield.

Additional features and advantages of the invention will be set forth in the description which follows, and in part will be apparent from the description, or may be learned by practice of the invention. The objectives and other advantages of the invention may be realized and attained by the structure particularly pointed out in the written description and claims hereof as well as the appended drawings.

To achieve these and other advantages and in accordance with the purpose of the present invention, as embodied and broadly described, the organic electroluminescence device includes a pixel including a plurality of sub-pixels, a buffer formed corresponding to each of the sub-pixels in a polygonal structure, an electrode separator formed along an outer periphery of the buffer to separate each of the sub-pixels, an emission region surrounded by the buffer, and an electric connection region formed in a region protruding from one side of the buffer having the polygonal structure.

In another aspect of the present invention, the fabrication method of an organic electroluminescence device includes preparing a first substrate having an array element with at least one TFT in each sub-pixel, forming a conductive spacer electrically connected to the TFT of the array element, forming a first electrode on a second substrate, forming a buffer on the first electrode in a polygonal structure corresponding to each sub-pixel, forming an electrode separator along an outer periphery of the buffer, and forming an emission region within an inner region defined by the buffer, sequentially forming an organic electroluminescent layer and a second electrode in the emission region, and forming an electric connection region at a region protruding from one side of the polygonal buffer, misaligning the first and second substrates by a predetermined position, and bonding the first and second substrates, wherein the conductive spacer is in contact with the electric connection region disposed on the second electrode.

In a further another aspect of the present invention, there is provided a fabrication method of an organic electroluminescence device includes forming a TFT within a partition region defined by gate lines and data lines on a substrate, sequentially forming a passivation layer and a first electrode on the substrate where the TFT is formed, forming a contact hole on predetermined portions of the passivation layer and the first electrode to expose a drain electrode of the TFT, forming a polygonal buffer and an electrode separator to define a region including the emission region and the contact hole in a sub-pixel structure misaligned with the gate lines and the data lines of the partition region by a predetermined position, forming an organic electroluminescent layer in the emission region defined by the buffer, forming a second electrode on the organic electrode luminescent layer, and connecting the second electrode with a drain electrode of the TFT through the contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 2:
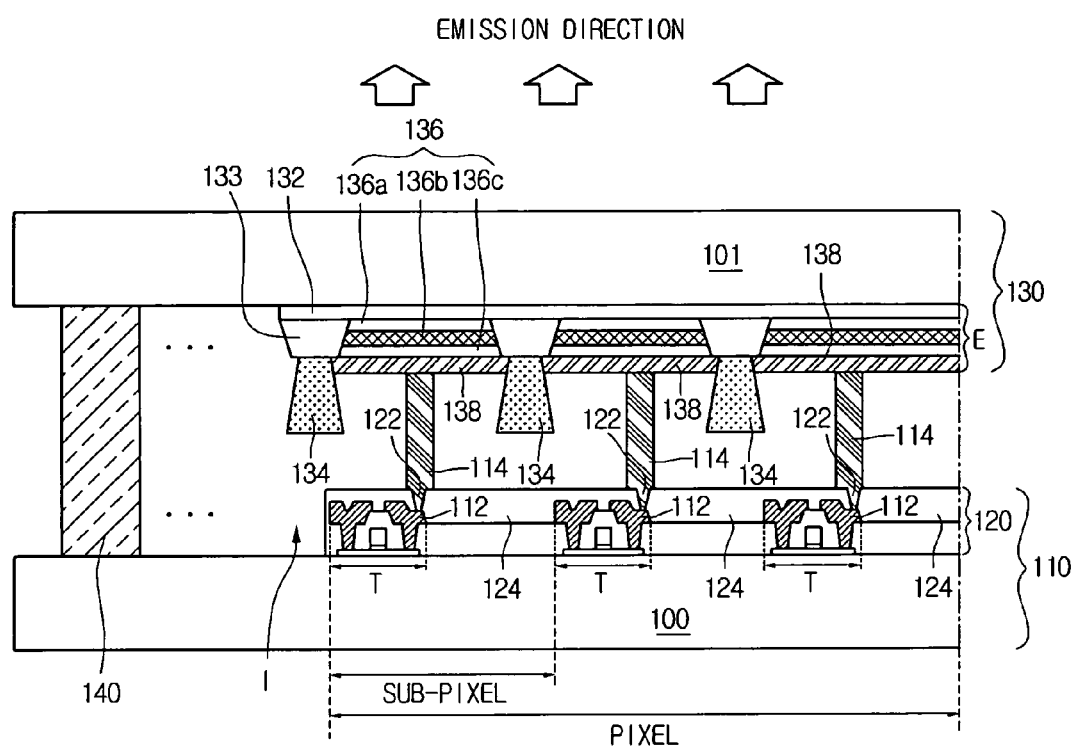
FIG. 2 is a schematic sectional view of a dual panel type organic electroluminescence device used in exemplary embodiments of the present invention.

FIG. 2 is a schematic sectional view of an exemplary dual panel type organic electroluminescence device according to the present invention. Referring to FIG. 2, first and second substrates 110 and 130 are spaced apart from each other by a predetermined distance. An array element 120 is formed on an inner surface of a transparent substrate 100 of the first substrate 110. An organic electroluminescent diode E is formed on an inner surface of a transparent substrate 101 of the second substrate 130. Edges of the first and second substrates 110 and 130 are encapsulated by a seal pattern 140.

The organic electroluminescent diode E includes a first electrode 132 serving as a common electrode, an electrode separator 134 disposed at a sub-pixel boundary below the first electrode 132, an organic electroluminescent layer 136 disposed between electrode separators 134, and a second electrode 138 patterned for each sub-pixel.

A buffer 133 is formed between the first electrode 132 and the electrode separator 134 and partitions individual emission regions, wherein the organic electroluminescent layer 136 is formed within each sub-pixel. In other words, the buffer 133 is formed to partition the individual emission region of each sub-pixel, and the electrode separator 134 is formed in a predetermined region of the buffer 133. Accordingly, the electrode separator 134 separates each sub-pixel.

The organic electroluminescent layer 136 includes a first carrier transporting layer 136a, an emission layer 136b and a second carrier transporting layer 136c, which are stacked sequentially. The first and second carrier transporting layers 136a and 136c inject electrons or holes into the emission layer 136b, or transport the electrons or holes. Also, the first and second carrier transporting layers 136a and 136c are determined by arrangement of anode and cathode electrodes. For example, when the emission layer 136b is formed of a high molecular compound, and the first and second electrodes 132 and 138 respectively serve as anode and cathode electrodes, the first carrier transporting layer 136a contacting the first electrode 132 has a stacked structure of a hole injection layer and a hole transporting layer, and the second carrier transporting layer 136c contacting the second electrode 138 has a stacked structure of an electron injection layer and an electron transporting layer. Moreover, the organic electroluminescent layer 136 may be formed of a high or low molecular compound. When the organic electroluminescent layer 136 is formed of the low molecular compound, it may be formed using a vapor deposition process. When the organic electroluminescent layer 136 is formed of the high molecular compound, it may be formed using an inkjet process.

The array element 120 includes TFTs T and serves as an electric driving unit to drive the organic electroluminescence device. In order to supply a current to the organic electroluminescent diode E, cylindrical conductive spacers 114 are disposed to connect the second electrode 138 and the TFTs T in a sub-pixel unit. Unlike a spacer for a general LCD, the conductive spacers 114 mainly aim to electrically connect the two substrates rather than to maintain a cell gap between two substrates. The conductive spacers 114 may have constant height to electrically connect a drain electrode 112 of the TFT T provided on the first substrate 110 in the sub-pixel unit and the second electrode 138 provided on the second substrate 130. The conductive spacer 114 causes pixels of the first and second substrates 110 and 130 to be attached in 1:1 correspondence, so that a current can flow therethrough. The conductive spacer 114 may be formed by coating an organic insulating cylinder with a metal. The metal for the conductive spacer 114 may be selected from a conductive material, preferably a metal having ductility and low specific resistance.

In FIG. 2, a passivation layer 124 is formed in a region that covers the TFT T, and includes a drain contact hole 122 to expose a portion of the drain electrode 112. The conductive spacer 114 is formed on the passivation layer 124 and is connected to the drain electrode 112 through the drain contact hole 122. Herein, the TFT T corresponds to a drive TFT connected to the organic electroluminescent diode E.

According to an exemplary embodiment of the present invention, the organic electroluminescence device is a top emission type that emits light from the organic electroluminescent layer 136 toward the second substrate 130. Preferably, the first electrode 132 is selected from conductive materials having transmissive properties, whereas the second electrode 138 is selected from opaque metal materials. Also, a space between the first substrate 110 and the second substrate 130 may be filled with inert gas or insulating liquid.

Although not shown in the drawings, the array element 120 further includes a scan line, a signal line and a power line that intersect the scan line and are spaced apart from each other by a predetermined distance, a switching TFT disposed at an intersection of the scan line and the signal line, and a storage capacitor. In the dual panel type organic electroluminescence device, the array element 120 and the organic electroluminescence diode E may be configured on different substrates. Thus, unlike the related art where the array element and the organic electroluminescence diode are formed on the same substrate, the organic electroluminescence diode E will not be affected by the yield of the array element 120. Therefore, the dual panel type organic electroluminescence device according to the present invention can improve the yield of the organic electroluminescence device in view of the production management of the respective elements.

If a screen is implemented in the top emission type organic electroluminescence device under the above-described arrangement, the TFTs T may be designed without considering aperture ratio, thereby improving an array process. Also, products having high aperture ratio and high resolution can be manufactured. Since the organic electroluminescence diode E is formed in a dual panel type organic electroluminescence device, an outer air can be blocked more effectively compared to the related art top emission type organic electroluminescence device, thereby enhancing stability of the products. In addition, since the TFT T and the organic electroluminescence diode E are respectively formed on the different substrates 110 and 130, degrees of freedom with respect to the arrangement of the TFTs T can be sufficiently obtained. Since the first electrode 132 of the organic electroluminescence diode E is formed on the transparent substrate 101, degrees of freedom with respect to the first electrode 132 can be increased.

Figure 3:
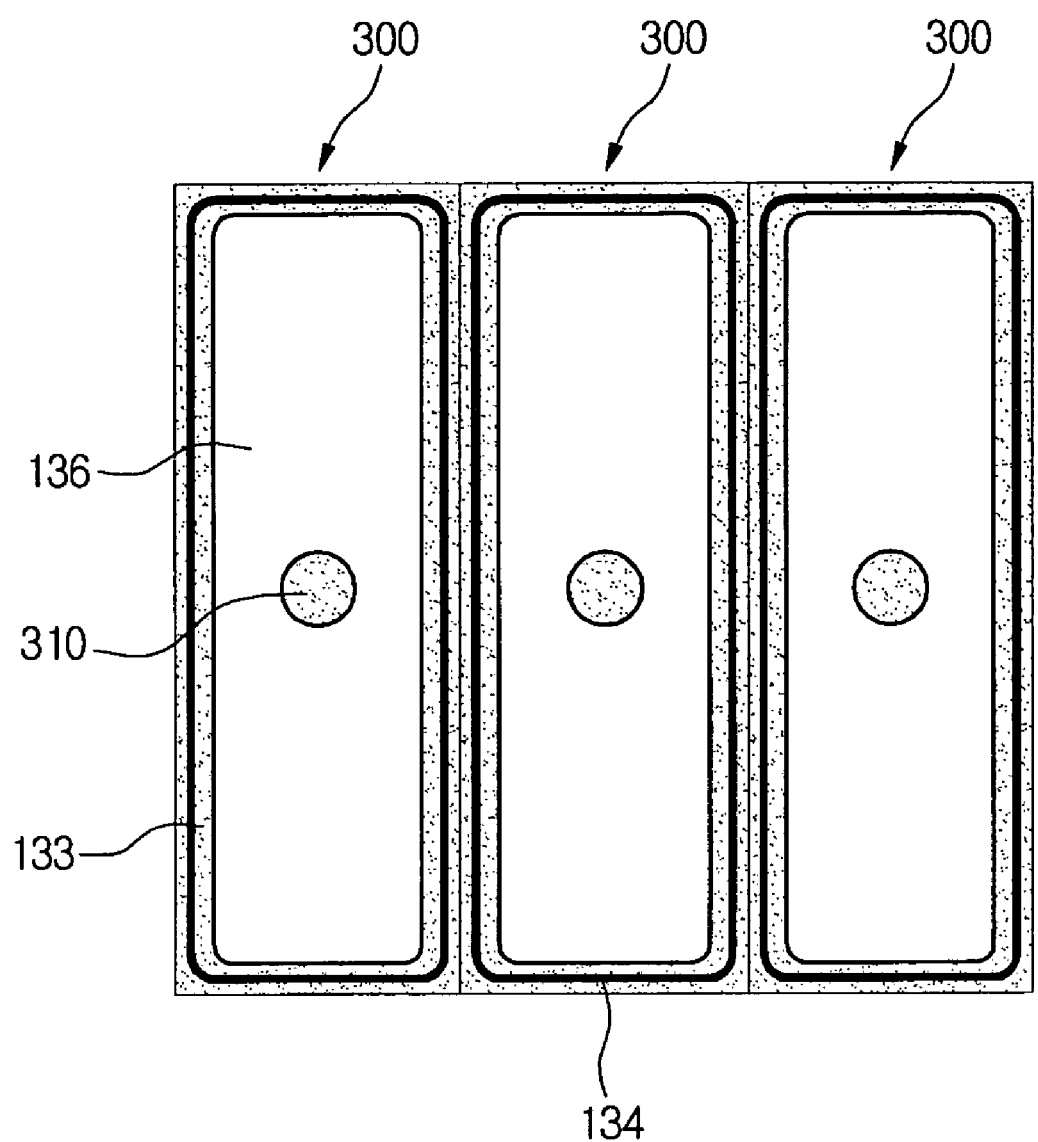
FIG. 3 is a schematic plan view of a second substrate in the dual panel type organic electroluminescence device of FIG. 2 according to an exemplary embodiment of the present invention.

In the dual panel type organic electroluminescence device, when the organic electroluminescent layer 136 is formed of a high molecular material, the flow of high molecular ink is obstructed if the position of the conductive spacer 114 contacting the second substrate 130 is within the emission region, where the organic electroluminescent layer 136 is formed. FIG. 3 is a schematic plan view of the second substrate 130 of the dual panel type organic electroluminescence device shown in FIG. 2 according to an exemplary embodiment of the present invention. For convenience of explanation, only one pixel region (three sub-pixels 300 in FIG. 3) is illustrated. Referring to FIG. 3, the three sub-pixels 300 are separated from one another by the buffer 133 and the electrode separator 134. The organic electroluminescent layer 136 is formed as an emission region within the buffer 133 in each of the sub-pixels 300. In other words, the buffer 133 is formed to partition the emission region of each of the sub-pixels, and the electrode separator 134 is formed in a predetermined region of the buffer 133. The electrode separators 134 separate the sub-pixels 300 from one another.

As described above, a portion contacting the conductive spacer 114 (of FIG. 2) provided in each of the sub-pixels 300 in the first substrate 110 (of FIG. 1) is disposed at the center of the emission region of the second substrate 130 (of FIG. 2). As shown in FIG. 3, a contact region 310 is formed at the center portion of each sub-pixel 300. Herein, when the organic electroluminescent layer 136 is formed of a high molecular material, the uniform film cannot be obtained because the contact region 310 obstructs the flow of the high molecular ink. In other words, when the ink of the high molecular organic luminescent material is jetted into each of the sub-pixels 300, the uniform spreading of the ink into the sub-pixels 300 is obstructed by high step and difference of surface energy due to the contact region 310. As a result, the dual panel type organic electroluminescence device shown in FIGS. 2 and 3 has considerable difficulty in forming the organic electroluminescent layer 136 of the high molecular material.

A structure of the organic electroluminescence device according to one exemplary embodiment of the present invention may be applied either to the dual panel type organic electroluminescence device where the emission region having the organic electroluminescent layer and the driving element are formed on separate substrates, or to the single panel type organic electroluminescence device where the emission layer and the driving element are formed on the same substrate.

Generally speaking, in the case of the dual panel type organic electroluminescence device, corresponding pixel regions of the first and second substrates are not accurately aligned. Instead, they are misaligned by position of conductive spacers designed on each substrate and then attached to each other. Thus, the position of the conductive spacer contact region is not restricted, thereby reducing design margin of the array elements provided on the first substrate. The emission region, where the organic electroluminescent layer is formed in each of the sub-pixels, is maximized to thereby improve the aperture ratio. In the case of the single panel type organic electroluminescence device, a partition region defined by gate and date lines and an emission region corresponding to the partition region are misaligned by a predetermined position. Accordingly, degrees of freedom and design margin of a contact hole for connecting a drive TFT and a second electrode of an organic electroluminescent diode can be improved and an aperture ratio can be increased by maximizing the emission region in each of the sub-pixels.

Figure 4:
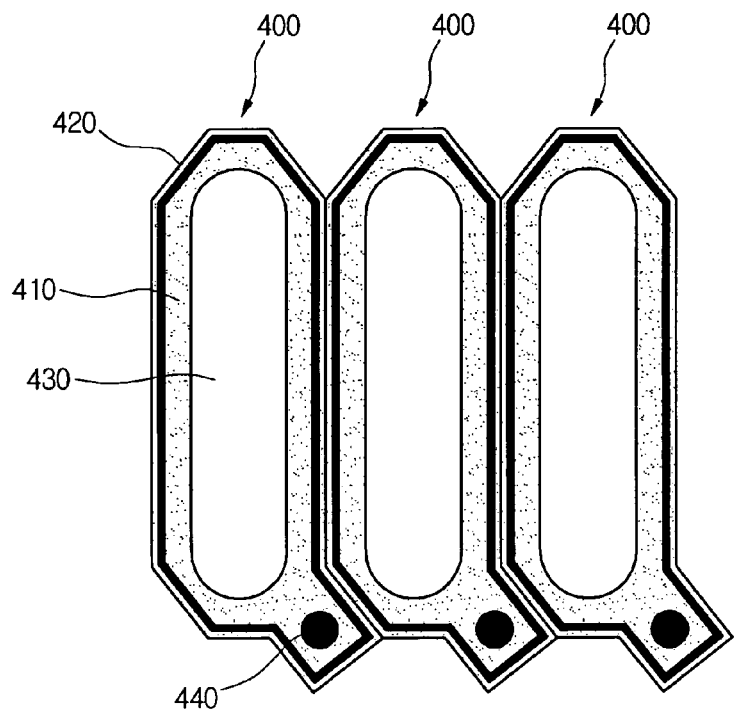
FIG. 4 is a schematic plan view of an organic electroluminescence device according to another exemplary embodiment of the present invention.

FIG. 4 is a schematic plan view of an organic electroluminescence device according to one exemplary embodiment of the present invention. For convenience of explanation, only one pixel region (three sub-pixels 400) is illustrated. Referring to FIG. 4, in each of the sub-pixels 400 of the organic electroluminescence device, a polygonal buffer 410 is formed corresponding to each of the sub-pixels 400, and an electrode separator 420 is formed along an outer periphery of the buffer 410 so as to separate the sub-pixels 400 from one another. An emission region 430 is disposed inside the buffer 410 and its edge is rounded. Also, an electric connection region 440 is disposed at a region protruding from one side of the polygonal buffer 410. In this exemplary embodiment, the organic electroluminescence device may be either the dual panel type or the single panel type.

In the case of the dual panel type organic electroluminescence device, the sub-pixel region is formed on the second substrate. This corresponds to the sub-pixel plane structure shown in FIG. 3. Each of the sub-pixels 400 formed on the second substrate has a polygonal outer periphery and an edge of the emission region 430 is rounded. The electric connection region 440, namely, a contact region of the conductive spacer for connecting the array element of the first substrate, is formed at one edge of the polygonal sub-pixel 400. Since the structure of the dual panel type organic electroluminescence device of FIG. 4 is identical to that of FIG. 2, except the sub-pixel structure shown in FIG. 4, a detailed description thereof will be described.

Figure 1:
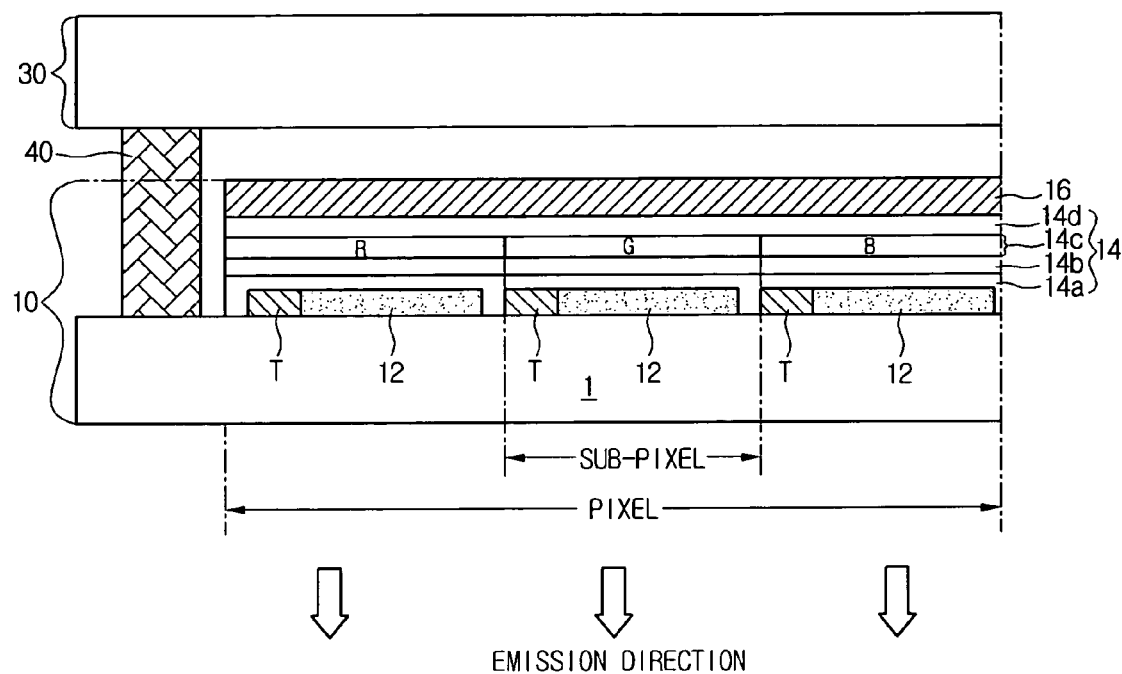
FIG. 1 is a schematic sectional view of a related art organic electroluminescence device according to the related art.

The drive TFT formed in the array element, namely, the electric driving unit of FIG. 1, is configured with the same structure as that shown in FIG. 2. Accordingly, the conductive spacer 114 disposed in the first substrate 110 is also formed at the same position as in FIG. 2. That is, if the first substrate and the second substrate corresponding thereto are accurately aligned and bonded, the conductive spacers 114 formed on the first substrate 110 are disposed corresponding to the emission regions where the organic electroluminescent layers are formed on the second substrate. In this exemplary embodiment, however, the electric connection region 440 and the conductive spacer 114 do not contact each other.

Specifically, the present invention shifts the first and second substrates 110 and 130 by a predetermined position such that the conductive spacer 114 of the first substrate 110 can be matched with the conductive spacer contact region of the second substrate, namely, the electric connection region 440. In such an arrangement, the first and second substrates 110 and 130 are misaligned and bonded with each other, thereby reducing the design margin of the array element 120 (including a plurality of TFTs) formed as the electric driving unit on the first substrate 110.

When the sub-pixel structure of the present invention is applied to the dual panel type organic electroluminescence device, the conductive spacer contact region (namely, the electric connection region 440) is formed in the region protruding from one side of the sub-pixel 400. Therefore, the emission region 430 of the sub-pixel 400 is maximized and thus the aperture ratio increases. Also, by rounding the edges of the emission region 430, the ink can be uniformly spread into the sub-pixels 400 when jetting the ink of the high molecular organic luminescent material. This can be possible when the first and second substrates 110 and 130 of the dual panel type organic electroluminescence device are misaligned and bonded with each other.

Figure 5:
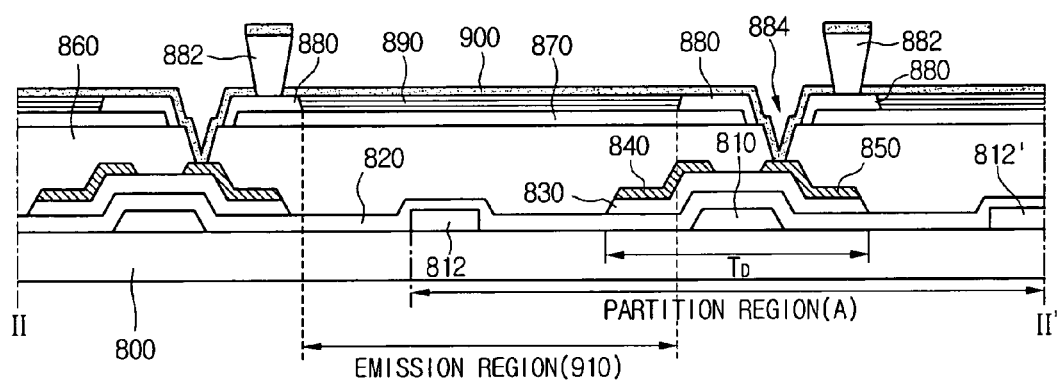
FIG. 5 is a schematic sectional view of a single panel type organic electroluminescence device according to another exemplary embodiment of the present invention.
Figure 6:
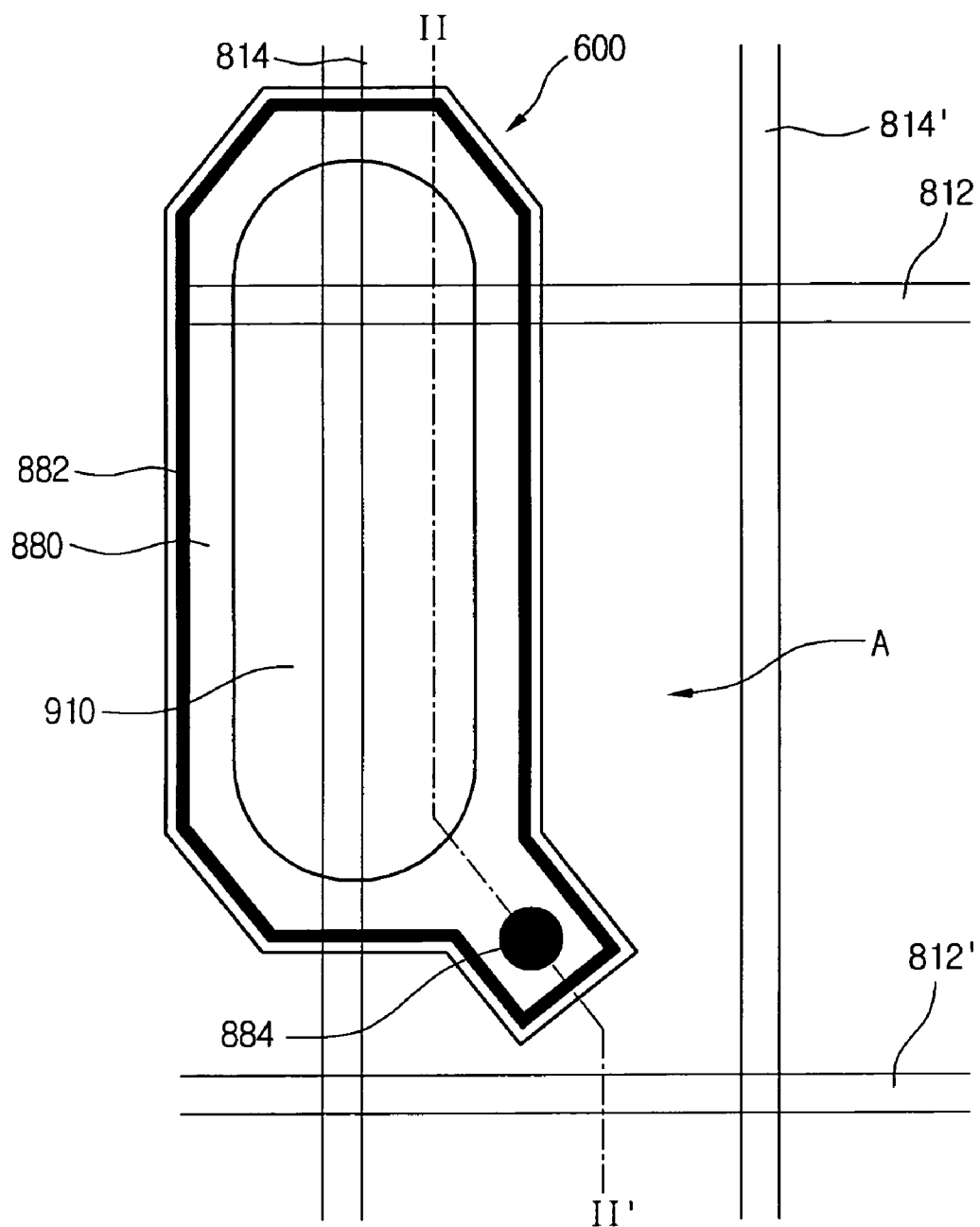
FIG. 6 is a schematic sectional view taken along line I-I' in FIG. 5.

The sub-pixel structure shown in FIG. 4 may also be applied to the single panel type organic electroluminescence device. In the case of the single panel type organic electroluminescence device, the region defined by the gate line and the data line and the corresponding emission region are misaligned by a predetermined position. FIG. 5 is a sectional view of the single panel type organic electroluminescence device and FIG. 6 is a sectional view taken along line I-I' of FIG. 5. A sub-pixel region 600 of FIG. 6 is configured with the same structure as that of FIG. 4.

Referring to FIGS. 5 and 6, a drive TFT $T_D$ is formed within a partition region A defined by gate lines 812 and 812' and data lines 814 and 814' on the substrate 800. The drive TFT $T_D$ includes a gate electrode 810, a gate insulating layer 820, and source/drain electrodes 840 and 850. The active layer 830 is formed between the source electrode 840 and the drain electrode 850.

The sub-pixel structure of the present invention includes a polygonal buffer 880 corresponding to the sub-pixel 600, an electrode separator 882 formed along an outer periphery of the buffer 880 to separate the sub-pixel 600 from another sub-pixel (not shown in FIG. 6), an emission region 910 disposed inside the buffer 880 of the sub-pixel 600 and having an edge rounded, and an electric connection region 884 disposed in the region protruding from one side of the polygonal buffer 880.

The electric connection region 884 is formed to electrically connect the drive TFT $T_D$ and an organic electroluminescent layer 890 of the emission region 910. In this exemplary embodiment, this function is performed by the contact hole 884 (of FIG. 5). Although the emission region 910 is formed within the partition region A, the present invention is not limited to this structure. For example, as shown in FIG. 5, the emission region 910 may be formed to overlap with a partition region adjacent to the partition region A, in addition to the sub-pixel region having the drive TFT $T_D$ for supplying a predetermined signal to a second electrode 900 of the organic electroluminescent diode. This means that the sub-pixel structure is misaligned in the partition region by a predetermined position.

The emission region 910 includes the second electrode 900 of the organic electroluminescent diode, which is connected to the drain electrode 850, the organic electroluminescent layer 890 formed between the second electrode 900 in a multi-layer or single-layer structure and a first electrode 870 for injecting holes into the organic electroluminescent layer 890.

In this exemplary embodiment, the conventional EL structure is applied when the organic electroluminescent diode is formed. That is, the organic electroluminescent diode is provided by sequentially depositing the first electrode (serving as an anode) 870, the organic electroluminescent layer 890, and the second electrode (serving as a cathode) 900. Alternatively, an electrode connected to the drain electrode 850 of the drive TFT $T_D$ may be used as the second electrode 900. Herein, the partition region A is defined by the gate lines 812 and 812' and the data lines 814 and 814' and is arranged in a matrix configuration. However, as shown in FIG. 6, in this exemplary embodiment, the partition region A is not separated by the electrode separator 882.

Referring to FIG. 5, the first electrode (the anode of the organic electroluminescent diode) 870 is entirely formed as the common electrode on the substrate 800 having the drive TFT $T_D$. The contact hole 884 is formed on the first electrode 870 of the drain electrode 850 and a passivation layer 860 so as to expose the drain electrode 850 of the drive TFT $T_D$. The buffer 880 and the electrode separator 882 are formed on a predetermined region of the first electrode 870. The organic electroluminescent layer 890 includes a hole injection layer (HIL), a hole transporting layer (HTL), an emission layer (EML) and an electron transporting layer (ETL), and is formed on the emission region 910 defined by the buffer 880 among the sub-pixel region between the electrode separators 882. Then, the second electrode 900 severing as the pixel electrode is formed such that the second electrode 900 and the drain electrode 850 are connected together through the contact hole 884.

As shown in FIGS. 5 and 6, the electrode separator 882 is not formed in the region that is overlapped with the gate lines 812 and 812', but is misaligned with the gate lines 812 and 812' by a predetermined position. In such an arrangement, the emission region 910 and the partition region A including the contact hole 884 of the drive TFT $T_D$ are misaligned. Thus, the contact hole 884 need not be provided at one side of the partition region. As shown in FIG. 6, the contact hole 884 is disposed at the region protruding from one side of the polygonal buffer 880, thereby maximizing an area of the emission region 910. Also, as shown in FIG. 6, the edge of the emission region 910 is rounded, thereby solving the problem of the spreading failure in forming the high molecular organic electroluminescent material.

In addition, the buffer 880 defines the emission region 910, where the organic electroluminescent layer 890 is formed. In this exemplary embodiment, the buffer 880 is formed in the polygonal structure. The emission region 910 is not limited to the partition region A where the drive TFT is formed. Herein, the second electrode 900 is separated by the electrode separator 882. The first electrode 870 is formed on an entire surface of the substrate other than the region where the contact hole 884 is formed, so that the first electrode 870 is connected in a pixel-to-pixel configuration.

As described above, when the sub-pixel structure of the present invention is applied to the single panel type organic electroluminescence device, the contact hole (that is, the electric connection region 884) is disposed on the region protruding from one side of the sub-pixel. Therefore, the emission region 910 of the sub-pixel can be maximized, thereby increasing the aperture ratio. Also, by rounding the edge of the emission region 910, the ink can be uniformly spread onto the sub-pixel when jetting the ink of the high molecular organic luminescent material. This can be possible by configuring the structure where the partition region A defined by the gate lines 812 and 812' and the data lines 814 and 814' are misaligned with the corresponding sub-pixel region 600.

According to the above-described exemplary embodiments of the present invention, production yield and production management efficiency can be improved. Since the organic electroluminescence device is the top emission type, the design of the TFTs becomes easy and high aperture ratio and high resolution can be provided. Also, since the electrode for the organic electroluminescence diode is formed on the substrate, various materials can be used. In addition, since the organic electroluminescence device is the top emission type and has the encapsulation structure, reliable products can be ensured.

Also, in the exemplary embodiments, the outer periphery of the sub-pixel is formed in the polygonal structure and the edges of the emission region are rounded. The conductive spacer contact region electrically connected to the TFT is formed at one side of the rounded edges of the emission region. In such an arrangement, the organic electroluminescent layer can be formed uniformly and the aperture ratio can be improved.

It will be apparent to those skilled in the art that various modifications and variations can be made in the organic electroluminescence device and fabrication method thereof the present invention without departing from the spirit or scope of the invention. Thus, it is intended that the present invention cover the modifications and variations of this invention provided they come within the scope of the appended claims and their equivalents.

What is claimed is:

1. An organic electroluminescence device, comprising:
    a pixel including a plurality of sub-pixels;
    a buffer formed in a polygonal structure corresponding to each of the plurality of sub-pixels;
    an electrode separator formed along an outer periphery of the buffer to separate the plurality of sub-pixels;
    an emission region surrounded by the buffer; and
    an electric connection region formed in an area protruding from one side of the buffer having the polygonal structure.

2. The organic electroluminescence device according to claim 1, wherein the emission region includes edges that are rounded.

3. The organic electroluminescence device according to claim 1, further comprising:
    an organic electroluminescent layer formed in the emission region; and
    first and second electrodes formed sandwiching the emission region that includes two surfaces in contact with the organic electroluminescent layer.

4. The organic electroluminescence device according to claim 3, wherein the organic electroluminescent layer is formed of a high molecular organic luminescent material.

5. The organic electroluminescence device according to claim 3, wherein the electric connection region is connected to at least one of the first and second electrodes so as to provide a predetermined voltage to the organic electroluminescent layer formed in the emission region.

6. The organic electroluminescence device according to claim 5, wherein the electric connection region is one of a conductive spacer contact region and a contact hole.

7. The organic electroluminescence device according to claim 6, wherein the electric connection region is the conductive spacer contact region, and the organic electroluminescence device is a dual panel type organic electroluminescence device including an array element, an organic electroluminescent diode, and a conductive spacer arranged between the array electrode and organic electroluminescent diode that are formed on different substrates.

8. The organic electroluminescence device according to claim 7,
    wherein the different substrates include first and second substrates that are spaced apart from each other by a predetermined distance, the first and second substrates having sub-pixels on which an image is formed;
    wherein the array element includes at least one drive TFT (thin film transistor) formed on an inner surface of the first substrate by sub-pixel unit, and the conductive spacer electrically connected to the drive TFT of the array element;
    wherein the first electrode is disposed on an inner surface of the second substrate, and the organic electroluminescent layer and a second electrode sequentially formed on the first electrode by sub-pixel unit; and
    wherein the first and second substrates are misaligned by a predetermined position and bonded with each other such that the conductive spacer is in contact with the conductive spacer contact region that is formed on the second electrode.

9. The organic electroluminescence device according to claim 6, wherein the electric connection region is the contact hole, and the organic electroluminescence device is a single panel type organic electroluminescence device including an array element and an organic electroluminescent diode that are formed on a single substrate.

10. The organic electroluminescence device according to claim 9,
wherein the array element includes a TFT formed within a partition region defined by gate and data lines on the single substrate, and the single substrate includes a passivation layer and the first electrode sequentially formed thereon;
wherein the contact hole is formed on predetermined portions of the passivation layer and the first electrode to expose a drain electrode of the TFT, and the buffer and the electrode separator are formed in a region including the emission region and the contact hole in a sub-pixel structure and are misaligned with the gate lines and the data lines of the partition region by a predetermined position; and
wherein the second electrode formed on the organic electroluminescent layer and connected to the drain electrode of the TFT through the contact hole.

11. The organic electroluminescence device according to claim 10, wherein the emission region includes the second electrode connected to the drain electrode of the TFT, the organic electroluminescent layer disposed below the second electrode, and the first electrode contacting with the organic electroluminescent layer.

12. The organic electroluminescence device according to claim 10, wherein the partition region and a corresponding sub-pixel region are misaligned by a predetermined position.

* * * * *